(12) United States Patent
Sievers

(10) Patent No.: US 10,831,105 B2
(45) Date of Patent: Nov. 10, 2020

(54) SYSTEM AND PROCESS FOR DIRECT CURING OF PHOTOPOLYMER PRINTING PLATES

(71) Applicant: Esko-Graphics Imaging GmbH, Itzehoe (DE)

(72) Inventor: Wolfgang Sievers, Kremperheide (DE)

(73) Assignee: Esko-Graphics Imaging GmbH, Itzehoe (DE)

( * ) Notice: Subject to any disclaimer, the term of this patent is extended or adjusted under 35 U.S.C. 154(b) by 0 days.

(21) Appl. No.: 16/629,061

(22) PCT Filed: Jul. 20, 2018

(86) PCT No.: PCT/EP2018/069780
§ 371 (c)(1),
(2) Date: Jan. 7, 2020

(87) PCT Pub. No.: WO2019/016376
PCT Pub. Date: Jan. 24, 2019

(65) Prior Publication Data
US 2020/0133129 A1 Apr. 30, 2020

Related U.S. Application Data

(60) Provisional application No. 62/534,962, filed on Jul. 20, 2017.

(51) Int. Cl.
*G03F 7/20* (2006.01)

(52) U.S. Cl.
CPC .......... *G03F 7/2055* (2013.01); *G03F 7/2012* (2013.01)

(58) Field of Classification Search
CPC ............................ G03F 7/2012; G03F 7/2055
See application file for complete search history.

(56) References Cited

U.S. PATENT DOCUMENTS 8,757,060 B2  6/2014  Wolterink et al.
9,463,595 B2  10/2016  De Rauw et al.
(Continued)

FOREIGN PATENT DOCUMENTS

EP    2466381 A1    6/2012
WO    2015004433 A1  1/2015
(Continued)

OTHER PUBLICATIONS

International Preliminary Report on Patentability and Written Opinion for International Application No. PCT/EP2018/069780, dated Jan. 21, 2020, 9 pages.

(Continued)

*Primary Examiner* — Steven Whitesell Gordon
(74) *Attorney, Agent, or Firm* — RatnerPrestia

(57) ABSTRACT

Apparatus and method for directly curing photopolymer printing plates, such as with UV radiation. Printing plates are cured directly by radiation, such as emitted from a high power UV laser beam. No LAMS layer or film bearing the image information is required on top of the polymer plate. The laser beam may be split into several individually-modulated beams by means of an Acousto Optical Deflector. Each individual beam is capable of curing pixels of the image that are to be transferred to the printing plate. Support shoulders for the printing details, formed by the pixels are determined by the caustic of the UV beam propagation.

26 Claims, 3 Drawing Sheets

(56) References Cited

U.S. PATENT DOCUMENTS

| | | | |
|---|---|---|---|
| 2001/0003032 A1 | 6/2001 | Harada et al. | |
| 2001/0052924 A1 | 12/2001 | Steinke et al. | |
| 2002/0149807 A1* | 10/2002 | Sumi | G03F 7/2055 |
| | | | 358/521 |
| 2003/0188650 A1* | 10/2003 | McLean | B41N 1/06 |
| | | | 101/401.1 |
| 2007/0014929 A1 | 1/2007 | Eggers | |
| 2009/0101845 A1 | 4/2009 | Neber et al. | |
| 2009/0294696 A1* | 12/2009 | Sievers | G03F 7/201 |
| | | | 250/492.1 |
| 2011/0300398 A1 | 12/2011 | Vest et al. | |
| 2014/0327185 A1 | 11/2014 | Sievers | |
| 2016/0311214 A1 | 10/2016 | Vest et al. | |
| 2017/0131636 A1* | 5/2017 | Vest | G03F 7/26 |

FOREIGN PATENT DOCUMENTS

| | | |
|---|---|---|
| WO | 2015007667 A1 | 1/2015 |
| WO | 2016052494 A1 | 4/2016 |
| WO | 2017072588 A3 | 5/2017 |
| WO | 2017203034 A1 | 11/2017 |

OTHER PUBLICATIONS

International Search Report and Written Opinion for International Application No. PCT/EP2018/069780, dated Nov. 20, 2018, 12 pages.

\* cited by examiner

SYSTEM AND PROCESS FOR DIRECT CURING OF PHOTOPOLYMER PRINTING PLATES

CROSS-REFERENCE TO RELATED APPLICATIONS

This is the U.S. National Phase of International Application No. PCT/EP2018/069780, filed Jul. 20, 2018, which claims priority to U.S. Provisional Application No. 62/534,962, filed Jul. 20, 2017. The disclosure of each of these applications is incorporated herein by reference in its entirety for all purposes.

BACKGROUND OF THE INVENTION

Transferring images to flexographic printing plates typically comprises placing a flexographic printing plate on a standard digital imager, such as a CDI Imager, manufactured by Esko. State of the art flexographic printing plates typically have a LAMs layer (Laser Ablatable Mask) disposed on top of the printing (front) surface of the plate.

In a typical first process step, the LAMs layer is partially removed by an infrared laser beam in the imager in a pattern corresponding to the image to the transferred. In a typical second process step, the photopolymer is selectively cured by UV light that penetrates the portions of the plate where the LAMs layer was removed. This second process step is usually done in a second device outside the imager. In a third process step, the non-cured portions of the photopolymer plate are selectively removed by a thermal or chemical process.

The LAMs layer adds to the overall cost of the plates, and removal of the layer by the infrared laser beam is not always perfect. Due to dust formed by re-condensation of the ablated layer, the tracks of the ablation can sometimes be recognized in the final image of the mask and may sometimes even transfer into the print, causing severe quality issues and compensation costs, including the cost of having to redo the printing plate.

Another problem of state of the art systems is that the plates between imaging and UV curing are prone to damage of the LAMs layer carrying the image information and also to damage of the non-cured polymer.

Dust generated by ablating the LAMs layer requires removal by an extraction unit followed by a filter system with filters that require periodic changing, causing system downtime and industrial waste, both raising the operation costs of the imager. Additional complexity is caused by the need to protect the optical system inside the imager from dust created by the ablation process.

Thus, many benefits may be achieved by elimination of the LAMs layer on the printing plate and the elimination of the ablation step and other system components, such as extraction unit, required because of complications arising from the ablation step. Other processes for creating a flexographic printing plate, such as using liquid polymer, also typically require some type of photomask, typically in the form of a removable film, as an integral part of the plate-making process. Avoidance of the need for any type of photomask is desirable to eliminate expense and waste.

SUMMARY OF THE INVENTION

One aspect of the invention comprises an imager for applying high resolution image information into a photopolymer printing plate. The imager comprises a front side radiation source configured to emit radiation suitable for curing the printing plate photopolymer, an imaging location for mounting the printing plate at a predetermined distance from the radiation source with the front surface facing the radiation source, a modulator disposed between the radiation source and the front surface of the printing plate, and a scanner mechanism for providing relative motion between the front surface of the printing plate and the radiation source. The modulator is configured to modulate radiation directed from the radiation source to the front surface, and the scanner mechanism is operable to cover all of the printing area with the modulated radiation source. A controller connected to the modulator and the scanner mechanism is configured to provide control signals for the modulator and the scanner mechanism operable to expose the front surface of the printing plate to modulated radiation corresponding to the high resolution image information. The imager preferably comprises optics configured to focus the radiation emitted by the radiation source to a focal spot slightly above the printing surface. A back side radiation source facing the back side of the printing plate may be positioned to provide an exposure to the back side along a processing path of the plate, wherein the processing path defines a sequential path of travel for the plate in a workflow extending between a first location anterior to the imaging position and a second location posterior to the imaging location.

In some embodiments, the radiation source comprises a fiber optic laser, whereas in others the radiation source may comprise an LED. The modulator may comprise an Acousto Optical Modulator and/or a deflector operable to split the radiation source into two or more beams.

In one configuration, the photopolymer printing plate comprises a sleeve, the imaging location comprises a drum, and the scanner mechanism comprises a motor for turning the drum along a drum rotation axis and a carriage for moving the radiation source parallel to the drum rotation axis.

In another configuration, the imager further comprises exposure glass for receiving the plate in the imaging location, with a first radiation source positioned to expose a first side of the plate through the exposure glass, a holder in proximity to the imaging position configured to hold and dispense a roll of a first film over the imaging position; a carriage configured to dispense liquid photopolymer onto the first film and a dispense a second film over the liquid photopolymer; and a second radiation source configured to expose a second side of the plate. In one embodiment, the first side of the plate is a back side of the plate, the first radiation source is a back side exposure source, the first film comprises a dimensionally stable layer of the printing plate, and the second radiation source comprises the front side radiation source. In another embodiment, the first side of the plate is a front side of the plate, the first radiation source is the front side radiation source, the second film comprises a dimensionally stable layer of the printing plate, and the second radiation source comprises a back side radiation source.

An imaging system may comprise the imager as described herein and a memory, in communication with the controller in the imager and configured to store data corresponding to the high resolution image information. The imaging system may further comprise the photopolymer printing plate, wherein the printing plate comprises a flexographic printing plate, preferably a printing plate having no LAMs layer.

Another aspect of the invention comprises a process for directly imaging a printing plate, such as a flexographic printing plate having no LAMS or photomask layer. The process comprising the steps of (a) placing a photopolymer printing plate in an imaging location at a predetermined distance from a radiation source, such as in any of the imager embodiments described herein, and (b) modulating the radiation from the radiation source while providing relative motion between the front surface of the printing plate and the radiation source sufficient to expose all of the printing area to modulated radiation in a pattern corresponding to high resolution imaging information. The modulating step may comprise splitting the radiation into two or more beams. The process preferably comprises focusing the modulated radiation onto a focal spot located a distance above the printing surface such that the modulated radiation propagates from the focal spot toward the plate in a beam having a conical shape suitable to create a cured profile in the polymer material that defines conically shaped support shoulders in printing features resulting from further processing of the printing plate. The conical shape of the support shoulders may therefore be determined by the diameter of the beam and the focal length of the focusing device, with a tip size determined by the distance between the focal spot and the surface of the polymer material.

The process may further comprise a step of exposing a back side of the printing plate opposite the front side to radiation along a processing path of the plate extending from prior to placing the plate in the imaging location to after placing the plate in the imaging location.

In a drum configuration, the photopolymer printing plate may comprise a sleeve, the step of placing the plate in the imaging location comprises placing the plate on the drum, and the step of providing the relative motion may comprises rotating the drum and moving the radiation source parallel to the drum rotation axis.

In a flatbed configuration, the process may further comprise the step of, prior to exposure of the printing plate, applying a liquid photopolymer to a substrate to form the photopolymer printing plate. An exemplary such process comprises disposing a first film over the imaging location, which imaging location comprises exposure glass, then applying the liquid polymer and a second film over the liquid polymer, then exposing a back side of the plate to adhere the liquid polymer to one of the first or second films, then imaging the front side of the plate.

DETAILED DESCRIPTION OF THE INVENTION

One aspect of the invention comprises combining the imaging and the curing steps by directly curing the photopolymer, with radiation of a suitable wavelength for curing the photopolymer, in a pattern corresponding to the image to be transferred to the printing plate. Suitable radiation, such as UV light, may be emitted by a radiation source, such as a laser, such as for example, a UV Fiber laser. One suitable such laser is a Model ULPN-QCW-355-200-R, made by IPG Photonics. Laser radiation sources are not limited to any particular type of laser or to a laser at all, as in some embodiments, the radiation source may comprise an LED source. The radiation source is thus not limited to any particular source type, configuration, or wavelength.

Directly curing the photopolymer eliminates any need for a LAMs layer, thereby permitting the use of less expensive printing plates. By combining imaging and curing, the polymer on the plate leaving the imager is much more resistant to operator handling, reducing the risk of financial loss to plate makers caused by damaged plates. Because two of the former process steps of imaging and curing are combined into a single imaging/curing process step, the floor space and purchase costs associated with the need for an additional UV curing device outside the imager can be avoided completely, by including an additional UV Light source for curing the back side of the polymer plate in the imaging system, as suggested in U.S. Pat. No. 8,757,060B2, assigned to the assignee of the present application, and incorporated herein by reference.

Figures 1A, 1B, 1C:
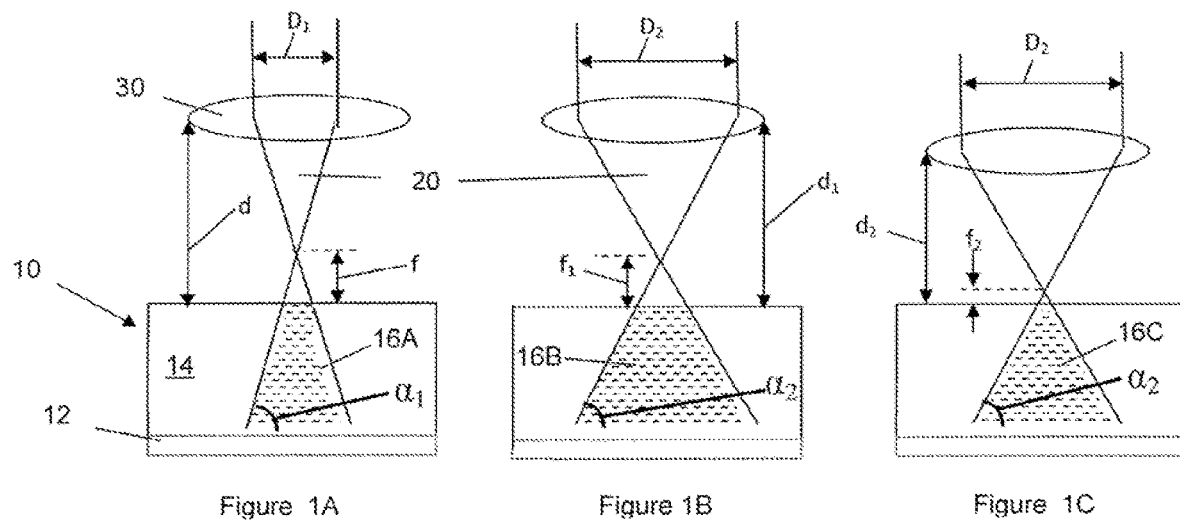
FIGS. 1A-1C depict variations in the conical shape formed in the cured polymer that may be effected by changing the location of the focal point of the radiation beam by changing the distance of the focusing optics from radiation source.

As is well known in the art, flexographic printing plates are typically exposed to form features in the plate comprised of a plurality of dots, each dot defined by one or more pixels. In particular, for isolated pixels not surrounded by other pixels, it is beneficial for the pixels to have a generally conical shape, extending from a relatively larger diameter at their base to a relatively smaller tip that receives the printing ink, the transition between the tip and the base being referred to herein as the "support shoulders" for the pixel (or in the case of many pixels close together, the shoulders of multiple pixels may collectively form shoulders that define the periphery of a multi-pixel printing feature). As shown in FIGS. 1A to 1C, the typical printing (front) side of a photopolymer printing plate 10 comprises a dimensionally stable layer 12 covered with photopolymer 14. Suitable materials for the dimensionally stable layer and photopolymer are well known in the art, including configurations for applying a liquid photopolymer to the dimensionally stable layer immediately prior to imaging, as described further herein. The photopolymer layer 14 may have one or more substantially transparent film layers thereover, not shown, particularly in liquid photopolymer embodiments. The shape of the cured portions of photopolymer 16A, 16B, 16C formed by the curing beam 20 can be varied by the beam diameter D and the distance d between the focusing optics 30 (e.g. a lens) and the photopolymer to be cured. Using a relatively smaller beam diameter will make the socket of the pixel smaller and steeper, whereas using a relatively bigger beam diameter will make the socket broader. Thus, for example, using the relatively smaller beam diameter $D_1$ of FIG. 1A as compared to $D_2$ of FIG. 1B, creates a conical shape of cured polymer 16A that has a relatively smaller volume than that of cured polymer 16B, and has an angle $\alpha_1$ that is relatively larger than angle $\alpha_2$. Similarly, as shown in FIGS. 1B and 1C, changing the relative distance d of the lens from the surface of the polymer changes the distance f of the focal spot from the polymer, and also changes the volume and shape of the cured polymer. Thus, for example, at the same distance of the lens 30 from the surface of the polymer 14, using a relatively larger beam $D_2$ as shown in FIG. 1B as compared to $D_1$ shown in FIG. 1A, results in the volume of cured polymer 16B having a greater volume than 16A, with a broader (smaller) angle $α_1$ as compared to angle $α_1$. Similarly, for example, using the same beam diameter $D_2$ as illustrated in FIGS. 1B and 1C, positioning the lens 30 at a relatively smaller distance $d_2$ as compared to $d_1$ from the surface of the photopolymer also moves the focal spot closer to the surface of the polymer (e.g. distance $f_2$ is relatively shorter than $f_1$), and the resulting cured polymer 16B has a greater volume than 16C, at the same angle $α_2$, because the truncated portion of the cone cured into the polymer starts at a relatively greater diameter cross-section of the cone at the surface of the polymer and extends to a relatively larger diameter cross-section of the cone at the base. Thus, the profile of the conical shape can be adjusted by the caustic of the laser beam propagation, and depending on the combination of beam diameter D and focal offset f, at a given focal length of the focus lens, the support shoulders may thus be made broader or steeper.

Due to the short wavelength, the focus spot size of the laser beam may be too small for the pixel size to be cured. Therefore, defocussing the beam by moving the focal point further away from the plate surface also adjusts the beam diameter at the plate surface to the diameter required by the image resolution.

In another aspect of the invention, the plate surface may be structured to improve ink transfer properties of the plate in the press. Methods of structuring the plate surface for improved ink transfer have been known for years. Some such methods use mechanical structuring similar to embossing after imaging, curing and removal of non-cured portions of the plate to provide structure to the plate surface, such as is described in WO2015007667A1, incorporated herein by reference. Other solutions for implementing structures into the image include WSI-Micro-screen technology from ESKO, described in pending application PCT/EP17/062769, titled METHOD FOR SMOOTHER TONAL RESPONSE IN FLEXOGRAPHIC PRINTING, assigned to an affiliate of the assignee, listing a common inventor with that of the present invention, and incorporated herein by reference.

Direct curing of the polymer enables a simpler method for structuring the plate surface. Structural properties preferably are defined to match ink properties and press conditions, and thus some effort is typically made to adjust the shape of the structures. In the ESKO WSI Micro-screen technology for example, the structure may be created by perforating the mask with individual laser pulses, with a control mechanism adjusting the mask opening size via the laser pulse energy.

With direct curing technology, the mask opening size is replaced by the size of the curing beam, which may be simply adjusted by modulating the distance between the focus lens and the polymer plate surface. Moving the focus closer to the plate surface will make the size of the cured details smaller; moving the focus further away will make the size bigger.

To increase the productivity of a direct curing system, the beam of radiation is preferably split into several beams using an Acousto Optical Deflector. A suitable deflector may be, for example, a model D1370-aQ120-9 from ISOMET. The beams are preferably oriented to be disposed an equal distance in the advance direction of the Imager, whereas the beam distance corresponds to the image resolution that shall be cured into the plate. Distributing the laser beam into several individual beams not only increases productivity, but also reduces the risk of the polymer being damaged by the high intensity of the laser beam.

As the curing result is not visible in the polymer of the printing plate until the non-cured portion is washed away, determining the correct focus positioning with respect to the polymer plate surface may pose some challenges. One method to check the focus position may comprise fixing a stripe of tape, such as 3M® Temflex® 1500 tape, on top of the polymer plate. UV light is absorbed by the tape, producing a detectable pattern having a size from which the focus distance can be derived, and the right focus spot size can then be determined on top of the tape and the working position for the focus on the polymer plate can adjusted by subtracting the thickness of the tape. In general, the focus position can be determined by engraving several tracks in the tape or on a test plate at different focus distances and identifying the track with the desired track width.

Figure 2:
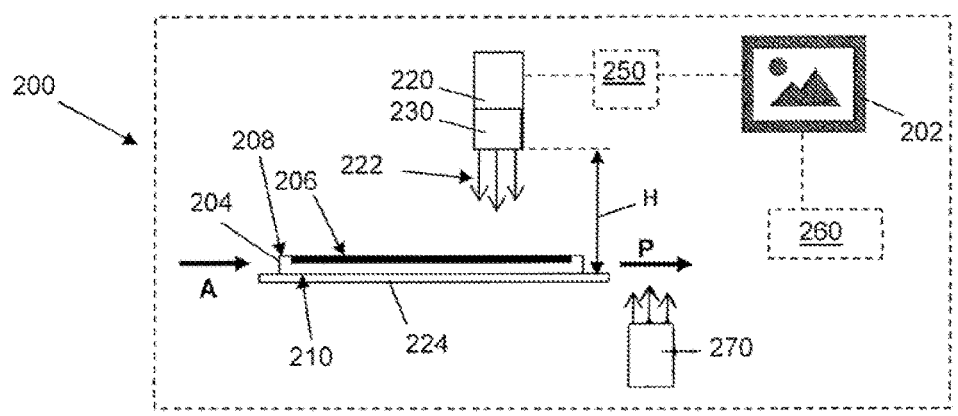
FIG. 2 is a schematic drawing of an imager and imaging system in accordance with one aspect of the invention.

Thus, as shown in FIG. 2, one aspect of the invention comprises an imager 200 for applying high resolution image information 202 into a photopolymer printing plate 204 having a printing area 206 on its front surface 208, and a back surface 210 opposite the front surface. The term "high resolution image information" refers to image information typically used in flexographic printing, including image information with and without individual structures defined within the printing dots. Front side radiation source 220 is configured to emit radiation 222 suitable for curing the printing plate photopolymer. During the curing step, printing plate 204 is mounted in an imaging location 224 positioned at a predetermined distance H from radiation source 220, with front surface 208 facing the radiation source. A control system 250 directs relative motion between the radiation source and the plate and modulates the radiation in a pattern corresponding to the image information 202, so that all portions of the plate in the printing area corresponding to pixels intended to transfer ink the image information are sufficiently cured to proceed to later processing of the plate. The image information 202 is typically provided from a computer memory 260 in a format readable by the controller. The memory may reside on the imager, or may reside remotely from the imager, with a signal provided to the controller that is readable or translatable by the controller into instructions for moving and modulating the radiation source.

Modulator 230 is configured to modulate the radiation directed from the radiation source. Although depicted as part of source 220 in FIG. 2, the modulator may be a distinct and discrete component in optical communication with the source but not integrally a part of the source. As noted above, the modulator may comprise an Acousto Optical Modulator and a deflector operable to split the radiation source into two or more beams. Details of suitable modulators are further described in U.S. Patent Application Ser. No. US20140327185, granted to the same inventor of the present application, and incorporated herein by reference. The invention is not limited to any particular modulator or deflector arrangement, however, and may comprise any system operable to impart radiation to a plate of intensity and resolution to directly cure the photopolymer on the plate in the desired pattern.

Figure 3:
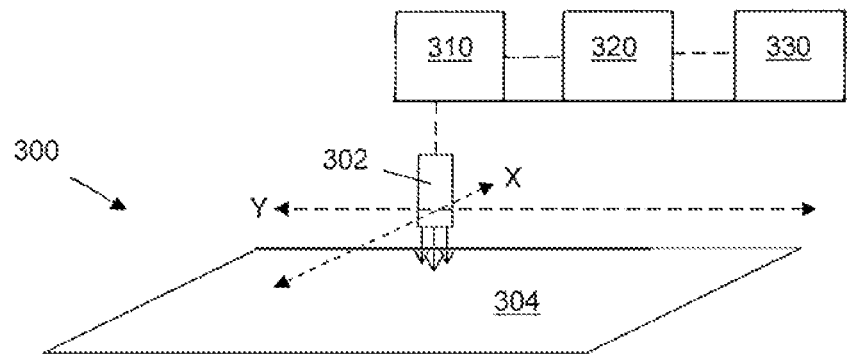
FIG. 3 is a schematic drawing of an exemplary flatbed imaging configuration.

The control system 250 typically comprises a scanner mechanism, such as mechanisms well known in the art in imaging technology, typically provides relative motion between the radiation source and the front surface of the printing plate such that all of the printing area is exposed to the modulated radiation. In one embodiment, shown in FIG. 3, a flatbed arrangement scanner mechanism 300 is configured to move light source 302 along the X and Y axes relative to the plate 304 in a rastering fashion, or in another variation, radiation source 302 may move along the X axis and plate 304 may move along the Y axis. In other variations, the light source may comprise a plurality of (e.g. LED) sources arranged in a bank that extends across the entire width of the plate in the X direction, and the bank light source or the plate may move in the Y direction. Fiber laser light sources typically operate in a rastering manner only. Such mechanisms are well known in the art, and typically comprise at least one or more drive mechanisms 310 configured to move the radiation source and/or the plate, connected to a controller 320 that controls the movements of the one or more drive mechanisms, and a power source 330.

Figure 4:
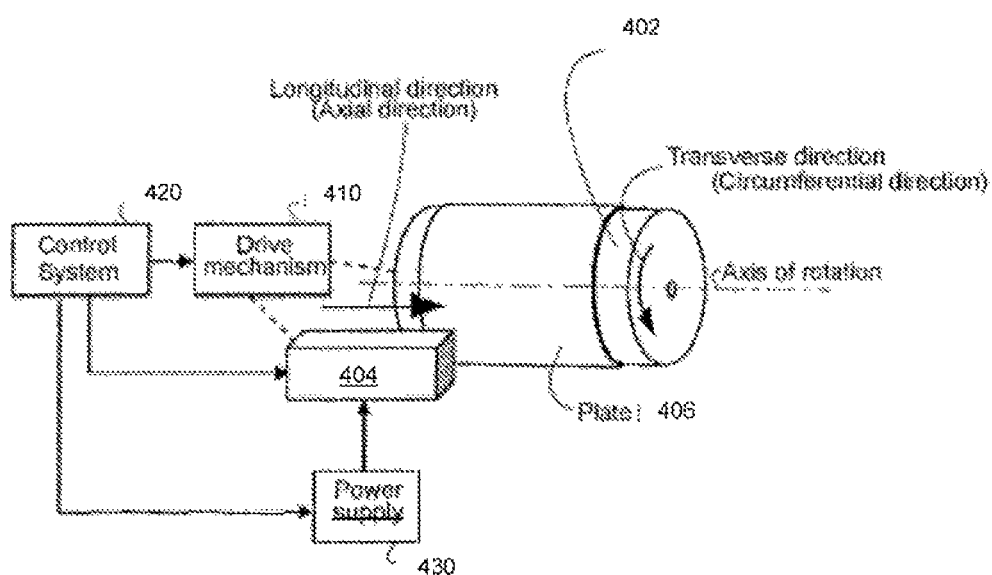
FIG. 4 is a schematic drawing of an exemplary drum imaging configuration.

In another embodiment, the scanner mechanism may comprise a drum exposure arrangement, as shown in FIG. 4. In the drum arrangement, the scanner mechanism comprises a drive mechanism 410 (such as a motor and a transmission system, including gearing, belt drives, or the like) that rotates drum 402 in a transverse, circumferential direction about an axis of rotation and that advances a carriage 404, on which is mounted the radiation source and associated optics, in a longitudinal (axial) direction parallel to the drum rotation axis, controlled by control system 420 and powered by power supply 430. Printing plate 406 in a drum configuration may be in the form of a sleeve, or may be rectangular sheet, with the drum configured to hold opposite edges of the sheet in place with any one of various clamping systems known in the art, while the drum rotates.

Ideally, the imager may also have a back side radiation source facing the back side of the printing plate and positioned to provide an exposure to the back side along a processing path of the plate. As shown in FIG. 2, plate 204 may move along a processing path defining a sequential path of travel for the plate in a workflow extending between a first location A anterior to the imaging position and a second location P posterior to the imaging location. Back side radiation source 270, shown in location B, may provide, for example, a line exposure to the back side as the plate moves over top of it. In alternative embodiments, however, back side radiation source 270 may be located in position A, or anywhere in the workflow between A and B, including in the imaging location 224, where the imaging location comprises a stage that is sufficiently transparent to the radiation to permit exposure, such as if the imaging location comprises exposure glass or other type of transparent plate. The back side radiation source may be a bank exposure that exposes the entire back side at one time, a line source as shown in FIG. 2, or a rastering source. In another embodiment, back side radiation source may be coordinated with the front side exposure so that the back side radiation precedes the front side radiation by an amount of time that is predetermined to maximize the final plate characteristics, such as is described in Published PCT Patent App. No. WO2017/072588, listing a common co-inventor with the present application, and incorporated herein by reference. In the drum configuration, the drum may be transparent and the back side radiation source may be located inside the drum, or the back side radiation source may be located along a process path through which the plate follows before being mounted on or after being dismounted from the drum.

One advantage of embodiments of the invention described herein, is that printing plates without a LAMs layer may be used, thereby avoiding all of the complications created by the need for a LAMs layer, as described herein above.

Thus, in one process for imaging a printing plate, the process may include a first step of placing a photopolymer printing plate in an imaging location at a predetermined distance from a radiation source, with the front (printing) surface facing the radiation source. The printing plate preferably comprises a photopolymer printing plate having a printing area on a front surface, without a LAMs layer. The radiation source may be any source suitable for curing the printing plate photopolymer. Next, the process comprises modulating the radiation from the radiation source while providing relative motion between the front surface of the printing plate and the radiation source sufficient to expose all of the printing area to modulated radiation in a pattern corresponding to the high resolution imaging information desired to transferred to the plate. As described above, the process preferably comprises focusing the modulated radiation onto a focal spot located a distance above the printing surface such that the modulated radiation propagates from the focal spot toward the plate in a beam having a conical shape suitable to create a cured profile in the polymer material that defines conically shaped support shoulders in printing features resulting from further processing of the printing plate. Also, as described above, the conical shape of the support shoulders is determined by the optical shape of a beam, with the tip of the optical shape having a size determined by the distance between the focal spot and the surface of the polymer material.

The process may further comprise the step of exposing a back side of the printing plate opposite the front side to radiation along a processing path of the plate extending from prior to placing the plate in the imaging location to after placing the plate in the imaging location. In a drum configuration, the photopolymer printing plate comprises a sleeve, the step of placing the plate in the imaging location comprises placing the plate on a drum, and the step of providing the relative motion comprises rotating the drum.

In a flatbed imager, direct curing also permits use of liquid photopolymer applied to the plate prior to imaging. The process may comprising applying a liquid photopolymer to a flat dimensionally stable support layer of the plate prior to the imaging the printing plate and prior to back exposure. Application of liquid photopolymer minimizes handling damage to the plate prior to imaging as compared to the use of solid photopolymer plates, permits reclaiming unexposed polymer, and reduces plate cost, overall. Creating printing plates using liquid polymer, generally, are well known and available in the art, with one exemplary and non-limiting embodiment described in U.S. Published Patent App. No. US20110300398 and US2016/0311214, incorporated herein by reference. In contrast to prior art processes, however, liquid polymer processes in connection with the present invention do not include incorporation of a photomask in the plate formation process. As used herein, the term "photomask" generally refers to any type of film negative or other layer comprising image information as is known in prior art processes for imparting the image information to the plate.

An exemplary process using a liquid photopolymer in connection may include the steps of a) placing a substantially transparent dimensionally stable layer onto an exposure glass, b) casting a liquid photopolymerizable resin layer onto the dimensionally stable layer; c) laminating a coverfilm to a surface of the liquid photopolymerizable resin layer that is opposite to the dimensionally stable layer as the liquid photopolymerizable resin layer is being cast onto the dimensionally stable layer; d) exposing the liquid photopolymerizable resin layer through the exposure glass and dimensionally stable layer to selectively crosslink and cure the photopolymerizable resin layer at a depth less than the height of the cast liquid photopolymerizable resin, to attach the polymer resin to the dimensionally stable layer, and e) directly exposing the opposite side of the photopolymerizable resin to the modulated radiation through the coverfilm in a pattern corresponding to a high resolution image, per the processes described herein. Then, steps for finishing the plate may comprise, reclaiming the unexposed polymer from the plate, removing the coverfilm, washing, rinsing, and finishing (fixing) the plate, all steps that are well known in the art. The dimensionally stable layer and the coverfilm may comprise a single layer each, or may comprise multilayer composites, and additional layers or coatings may be disposed under or over each layer, to impart desired functionality. Thus, the invention is not limited to any particular structure comprising the liquid polymer, nor is it limited to any particular type of liquid polymer. Suitable liquid polymers are well known in the art, including but not limited to, AVantage® liquid photopolymers marketed by Anderson & Vreeland or Bryan, Ohio, United States.

Thus, the present invention permits use of a single apparatus for applying liquid photopolymer and directly exposing the plate, including a spool for holding a roll of coverfilm to be spread across the exposure glass, a first carriage for simultaneously applying the photopolymerizable resin layer onto the dimensionally stable layer along with the coverfilm, a back exposure unit disposed underneath the exposure glass, and a second carriage for scanning the radiation source across the photopolymer in the X and Y directions. For example, the footprint for travel of the first carriage may be nested inside the footprint of the second carriage so that the first carriage can traverse the plate from one end to the other without interfering with the second carriage in a non-use position.

Figure 5:
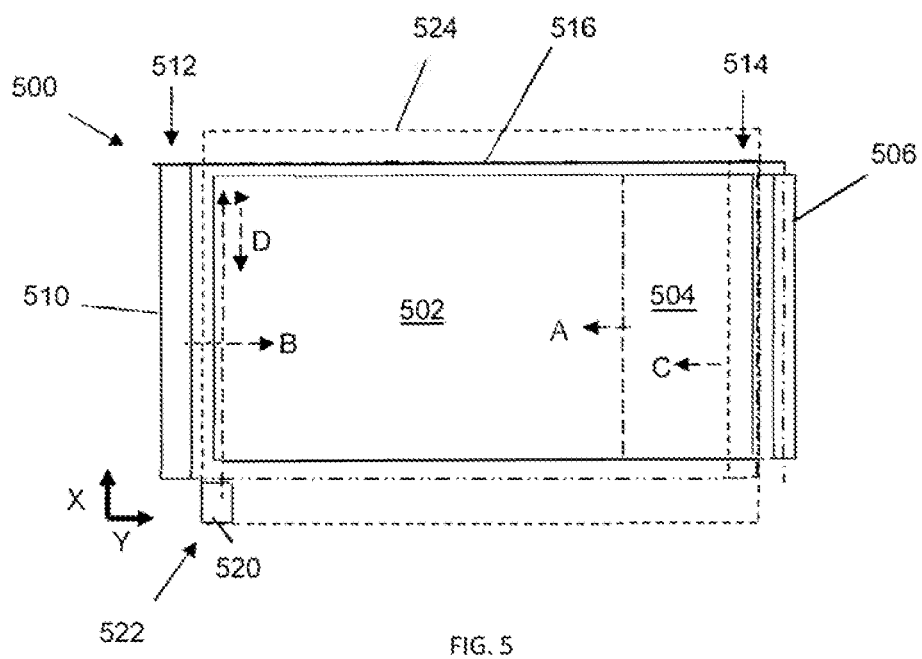
FIG. 5 is a schematic drawing of an exemplary flatbed imaging configuration configured to create the printing plate by applying liquid polymer to a dimensionally stable layer prior to imaging.

Thus, for example, FIG. 5 depicts a plan view of an exemplary exposure system 500 comprising exposure glass 502, over which the dimensionally stable layer 504 is then disposed by dispensing it from a roll 506 of material along arrow A, and cutting it to cover the exposure glass. As used herein, the term "glass" with reference to the exposure glass, may comprise any materials, including various plastics and resinous materials, suitable for providing the durability, transparency, and rigidity required for the subject application, and is not limited to "glass" per se. Furthermore, although described as transparent, it should be understood that the glass may not be 100% transparent, and some losses may occur in radiation intensity through the glass. Thus, the term "transparent" as used herein, means sufficiently translucent to provide a level of exposure desired on the backside of the plate, once formed.

Next, polymer application carriage 510 traverses the exposure glass along the X direction along arrow B from a storage position 512 to a starting position 514, and then dispenses the liquid photopolymer and coverfilm from the carriage, while the carriage traverses back to the storage position in the direction of arrow C, as is known in the art. Thus, the envelope of travel of carriage 510 is outlined by box 516 marked by a first style of dashed lines. After the photopolymer has been applied, a backside exposure may be provided from underneath exposure glass 502, to fix the photopolymer to the dimensionally stable layer. Then, the radiation source and imaging optics 520 scans the plate along the X and Y direction in a rastering fashion along the path of arrows D starting from a storage position 522, moving within the envelope defined by box 524, marked by dashed lines different than those of box 516, in accordance with instructions provided by its control mechanism. In this way, the high resolution image is directly cured into the front side of the plate.

It should be understood that although illustrated with the back side exposure from underneath the imaging glass and the front exposure from the top, the positioning of the front and back source may be reversed (and thus, the dimensionally stable layer and the coversheet interchanged in the process as described above). Thus, in an alternate embodiment, the second carriage may be located on the other side of class 502, in which case it does not interfere with the envelope of movement of carriage 510. It should also be understood, that a non-reflective cover (not shown) may be closed over the plate during the back exposure step, or a non-reflective shutter disposed under the exposure glass during the front side exposure step in the arrangement shown. Similarly, in an arrangement in which the back side exposure is provided from the top, a cover may be provided with a bank back-side exposure source for effective that step. Although shown in FIG. 5 with exemplary storage positions 512 and 522, and envelopes of travel 516 and 524, for the polymer application carriage and imaging carriage, respectively, it should be understood that the storage locations and envelopes may have any location and shape, respectively, so long as both carriages are sufficiently able to traverse the entirety of the portion of the plate desired to be covered without interfering with the other in its storage position.

Although the invention is illustrated and described herein with reference to specific embodiments, the invention is not intended to be limited to the details shown. Rather, various modifications may be made in the details within the scope and range of equivalents of the claims and without departing from the invention.

What is claimed:

1. An imager for applying high resolution image information into a photopolymer printing plate having a printing area on a front surface thereof and a back surface opposite the front surface, the imager comprising:
   a front side radiation source configured to emit radiation suitable for curing the printing plate photopolymer;
   an imaging location for mounting the printing plate at a predetermined distance from the radiation source with the front surface facing the radiation source;
   optics configured to focus the radiation emitted by said radiation source to a focal spot located above the front surface of the plate;
   a modulator disposed between the radiation source and the front surface of the printing plate, the modulator configured to modulate radiation directed from the radiation source to the front surface as modulated radiation;
   a scanner mechanism for providing relative motion between the front surface of the printing plate and the radiation source, the scanner mechanism operable to cover all of the printing area with the modulated radiation; and
   a controller connected to the modulator and the scanner mechanism and configured to provide control signals for the modulator and the scanner mechanism operable to expose the front surface of the printing plate to the modulated radiation in a pattern corresponding to the high resolution image information.

2. The imager of claim 1, further comprising a back side radiation source facing the back side of the printing plate positioned to provide an exposure to the back side along a processing path of the plate.

3. The imager of claim 2, wherein the processing path defines a sequential path of travel for the plate in a workflow extending between a first location anterior to the imaging position and a second location posterior to the imaging location.

4. The imager of claim 1, wherein the radiation source comprises a laser.

5. The imager of claim 1, wherein the radiation source comprises an LED.

6. The imager of claim 1, wherein the modulator comprises an Acousto Optical Modulator.

7. The imager of claim 1, wherein the modulator comprises a deflector operable to split the radiation source into two or more beams.

8. The imager of claim 1, wherein the photopolymer printing plate comprises a sleeve, the imaging location comprises a drum, and the scanner mechanism comprises a motor for turning the drum along a drum rotation axis and a carriage for moving the radiation source parallel to the drum rotation axis.

9. An imaging system comprising:
the imager of claim 1;
a memory, in communication with the controller, the memory
configured to store data corresponding to the high resolution image information.

10. The imaging system of claim 9, further comprising the photopolymer printing plate, wherein the printing plate comprises a flexographic printing plate.

11. The imaging system of claim 10, wherein the printing plate has no LAMS layer or photomask.

12. The imaging system of claim 1, wherein focal spot is located above the front surface of the plate at a distance at which radiation propagated from the focal spot toward the plate defines a beam having a conical shape configured to cure conically-shaped support shoulders of printing features in the photopolymer material of the plate.

13. An imager for applying high resolution image information into a photopolymer printing plate having a printing area on a front surface thereof located on one of a first or second side of the plate and a back surface opposite the front surface and located on the other of the first or second side of the plate, the imager comprising:
exposure glass for receiving the plate in an imaging location at a predetermined distance from a first radiation source positioned to expose the first side of the plate through the exposure glass to radiation suitable for curing the printing plate photopolymer;
a holder in proximity to the imaging position configured to hold and dispense a roll of a first film over the imaging position;
a carriage configured to dispense liquid photopolymer onto the first film and a dispense a second film over the liquid photopolymer; and
a second radiation source configured to expose the second side of the plate;
a modulator disposed between one of the first or second radiation sources and the front surface of the printing plate, the modulator configured to modulate radiation directed from the one of the first or second radiation sources to the front surface of the printing plate as modulated radiation;
a scanner mechanism for providing relative motion between the front surface of the printing plate and the one of the first or second radiation sources, the scanner mechanism operable to cover all of the printing area with the modulated radiation; and
a controller connected to the modulator and the scanner mechanism and configured to provide control signals for the modulator and the scanner mechanism operable to expose the front surface of the printing plate to the modulated radiation in a pattern corresponding to the high resolution image information.

14. The imager of claim 13, further comprising optics configured to focus the radiation emitted by one of said first or second radiation sources to a focal spot above the front surface of the plate.

15. The imager of claim 13, wherein the first side of the plate is the back side of the plate, the first radiation source is a back side exposure source, the first film comprises a dimensionally stable layer of the printing plate, and the second radiation source comprises a front side radiation source.

16. The imager of claim 13, wherein the first side of the plate is the front side of the plate, the first radiation source is a front side radiation source, the second film comprises a dimensionally stable layer of the printing plate, and the second radiation source comprises a back side radiation source.

17. A process for imaging a printing plate, the process comprising the steps of:
(a) placing a photopolymer printing plate in an imaging location at a predetermined distance from a radiation source, the printing plate comprising a photopolymer printing plate having a printing area on a front surface thereof, the radiation source suitable for curing the printing plate photopolymer, the plate placed in the imaging location with its front surface facing the radiation source;
(b) focusing the modulated radiation onto a focal spot located a distance above the printing surface such that the modulated radiation propagates from the focal spot toward the plate in a beam having a conical shape suitable to create a cured profile in the photopolymer material that defines conically shaped support shoulders in printing features resulting from further processing of the printing plate; and
(c) modulating the radiation from the radiation source while providing relative motion between the front surface of the printing plate and the radiation source sufficient to expose all of the printing area to modulated radiation in a pattern corresponding to high resolution imaging information.

18. The process of claim 17, wherein the conical shape of the support shoulders is determined by the diameter of the beam and the focal length of the focusing device.

19. The process of claim 18, wherein the conical shape has a tip having a tip size determined by the distance between the focal spot and the surface of the polymer material.

20. The process of claim 17, further comprising the step of exposing a back side of the printing plate opposite the front side to radiation along a processing path of the plate extending from prior to placing the plate in the imaging location to after placing the plate in the imaging location.

21. The process of claim 17, wherein the modulating step comprises splitting the radiation into two or more beams.

22. The process of claim 17, wherein the photopolymer printing plate comprises a flexographic printing plate.

23. The process of claim 22, wherein the printing plate has no LAMs or photomask layer.

24. The process of any of claim 17, wherein the photopolymer printing plate comprises a sleeve, the step of placing the plate in the imaging location comprises placing the plate on a drum, and the step of providing the relative motion comprises rotating the drum and moving the radiation source parallel to the drum rotation axis.

25. The process of any of claim 17, further comprising the step of, prior to exposure of the printing plate, applying a liquid photopolymer to a substrate to form the photopolymer printing plate.

26. A process for imaging a photopolymer printing plate in an imaging location comprising exposure glass located a predetermined distance from a front side actinic radiation source suitable for curing the photopolymer of the printing plate, the process comprising the sequential steps of:
   (a) forming the photopolymer printing plate having a printing area on a front surface thereof facing the front side radiation source, the forming step comprising disposing a first film over the exposure glass, then applying a liquid polymer over the first film and a second film over the liquid polymer;
   (b) exposing a back side of the plate to actinic radiation to adhere the liquid polymer to one of the first or second films; and
   (c) modulating the radiation from the front side radiation source while providing relative motion between the front surface of the printing plate and the front side radiation source sufficient to expose all of the printing area to modulated radiation in a pattern corresponding to high resolution imaging information.

* * * * *